US006529048B2

United States Patent
Zanchi

(10) Patent No.: US 6,529,048 B2
(45) Date of Patent: Mar. 4, 2003

(54) DYNAMIC SLEW-RATE BOOSTER FOR CMOS-OPAMPS

(75) Inventor: Alfio Zanchi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 10/106,730

(22) Filed: Mar. 26, 2002

(65) Prior Publication Data

US 2002/0140476 A1 Oct. 3, 2002

Related U.S. Application Data

(60) Provisional application No. 60/279,941, filed on Mar. 29, 2001.

(51) Int. Cl.[7] .................................................. H03K 5/22
(52) U.S. Cl. ............................ 327/65; 327/67; 327/335; 327/563
(58) Field of Search .......................... 327/333, 65, 66, 327/67, 77, 89, 52–55, 57, 560–563, 335; 330/252, 253, 260; 326/80, 81

(56) References Cited

U.S. PATENT DOCUMENTS

| | | | | |
|---|---|---|---|---|
| 3,643,108 A | * | 2/1972 | Pilkington | 327/55 |
| 3,882,326 A | * | 5/1975 | Kruggel | 327/63 |
| 5,293,514 A | * | 3/1994 | Nakagawara | 327/65 |
| 5,298,801 A | * | 3/1994 | Vorenkamp et al. | 327/65 |
| 5,345,346 A | * | 9/1994 | Brannon et al. | 330/260 |
| 5,418,498 A | * | 5/1995 | DeVito et al. | 330/252 |
| 5,917,377 A | * | 6/1999 | Asazawa | 330/252 |

OTHER PUBLICATIONS

K. Nagaraj, "CMOS Amplifiers Incorporating a Novel Slew Rate Enhancement Technique" IEEE, pp. 11.6.1–11.6.5, 1990.

F. Yang, P. Loumeau, P. Senn, "Novel Output Stage for DC Gain Enhancement of Opamp and OTA", Electronic Letters, vol. 29, No. 11, pp. 958–959, May 27, 1993.

* cited by examiner

Primary Examiner—Toan Tran
(74) Attorney, Agent, or Firm—Alan K. Stewart; W. James Brady, III; Frederick J. Telecky, Jr.

(57) ABSTRACT

The opamp with a slew rate booster includes a first high side transistor 23 coupled to a first differential output node OUT−; a second high side transistor 26 coupled to a second differential output node OUT+; a first booster circuit 72 coupled to the control node of the first high side transistor 23; a second booster circuit 70 coupled to the control node of the second high side transistor 26. The opamp exploits the gate control available on the high side transistors 23 and 26. During the charge-discharge differential transient of the load capacitances 58 and 60, the circuit increases the current given by the high side transistor 23 or 26 that is pulling up its output OUT− or OUT+, and reduces by the same amount the current provided at the other output OUT+ or OUT− that is being pulled down by a low side driver 43 or 40. The gate control is accomplished through a simple, symmetrical capacitor-resistor network that implements a basic differentiator.

17 Claims, 4 Drawing Sheets

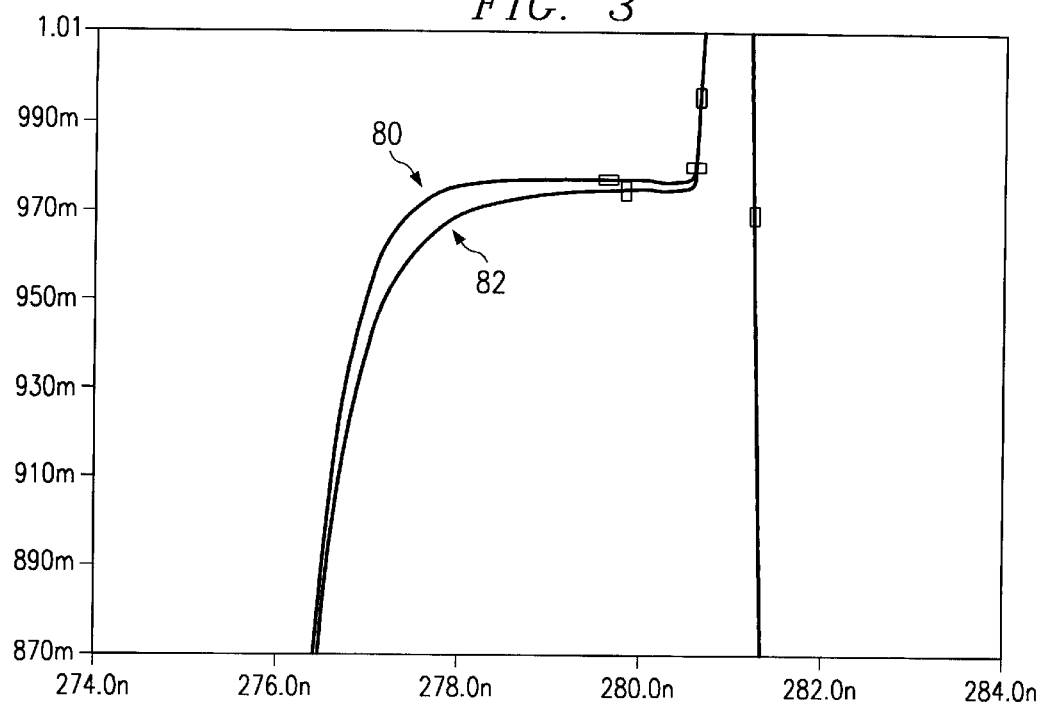
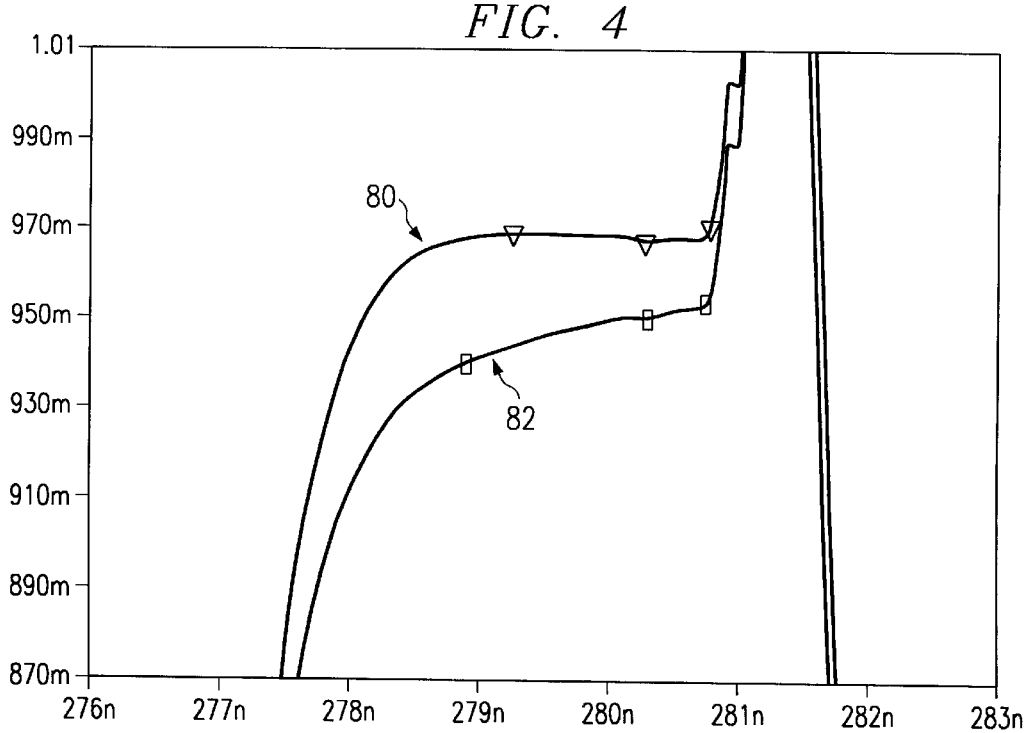

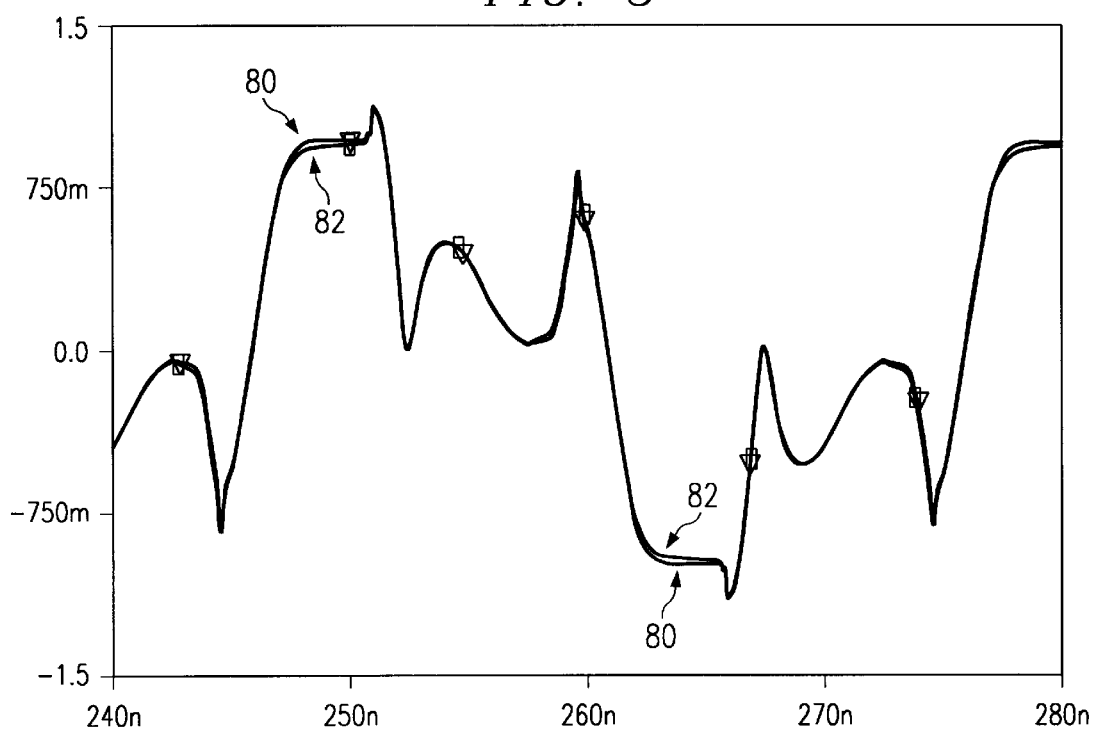

DYNAMIC SLEW-RATE BOOSTER FOR CMOS-OPAMPS

This application claims priority under 35 USC §119 (e)(1) of provisional application No. 60/279,941 filed Mar. 29, 2001.

FIELD OF THE INVENTION

This invention generally relates to electronic systems and in particular it relates to opamps with a dynamic slew-rate booster.

BACKGROUND OF THE INVENTION

The analog core of pipeline high-speed, high-resolution analog-to-digital converters (ADCs) requires the adoption of opamps both very fast and with high gain. While the prior art opamp designs often seem to be optimized if inspected via AC simulations, these opamps reveal an insufficient load charging performance at a subsequent transient analysis, and do not settle properly in the few nanoseconds available. This shortcoming has been verified both on rising and falling transitions of the differential output of opamps using active loads.

The prior art approach to opamp speed-up encompasses increasing the current in the stage (leads to swing and power consumption issues), enlarging the transistors' size (area occupation, and parasitics worsening), or shrinking the external capacitors (conflicts with kT/C noise floor limits). Moreover, bulky output buffer stages harm the stability of the opamp loop.

SUMMARY OF THE INVENTION

An opamp with a slew rate booster includes a first high side transistor coupled to a first differential output node; a second high side transistor coupled to a second differential output node; a first booster circuit coupled to the control node of the first high side transistor; a second booster circuit coupled to the control node of the second high side transistor. The opamp exploits the gate control available on the high side transistors 23 and 26. During the charge-discharge differential transient of the load capacitances 58 and 60, the circuit increases the current given by the high side transistor 23 or 26 that is pulling up its output OUT− or OUT+, and reduces by the same amount the current provided at the other output OUT+ or OUT− that is being pulled down by a low side driver 43 or 40. The gate control is accomplished through a simple, symmetrical capacitor-resistor network that implements a basic differentiator.

BRIEF DESCRIPTION OF THE DRAWINGS

In the drawings:

FIGS. 3–5 are plots of standard transient simulations applied to the opamp structures of FIG. 1 and 2.

DESCRIPTION OF PREFERRED EMBODIMENTS

Figure 1:
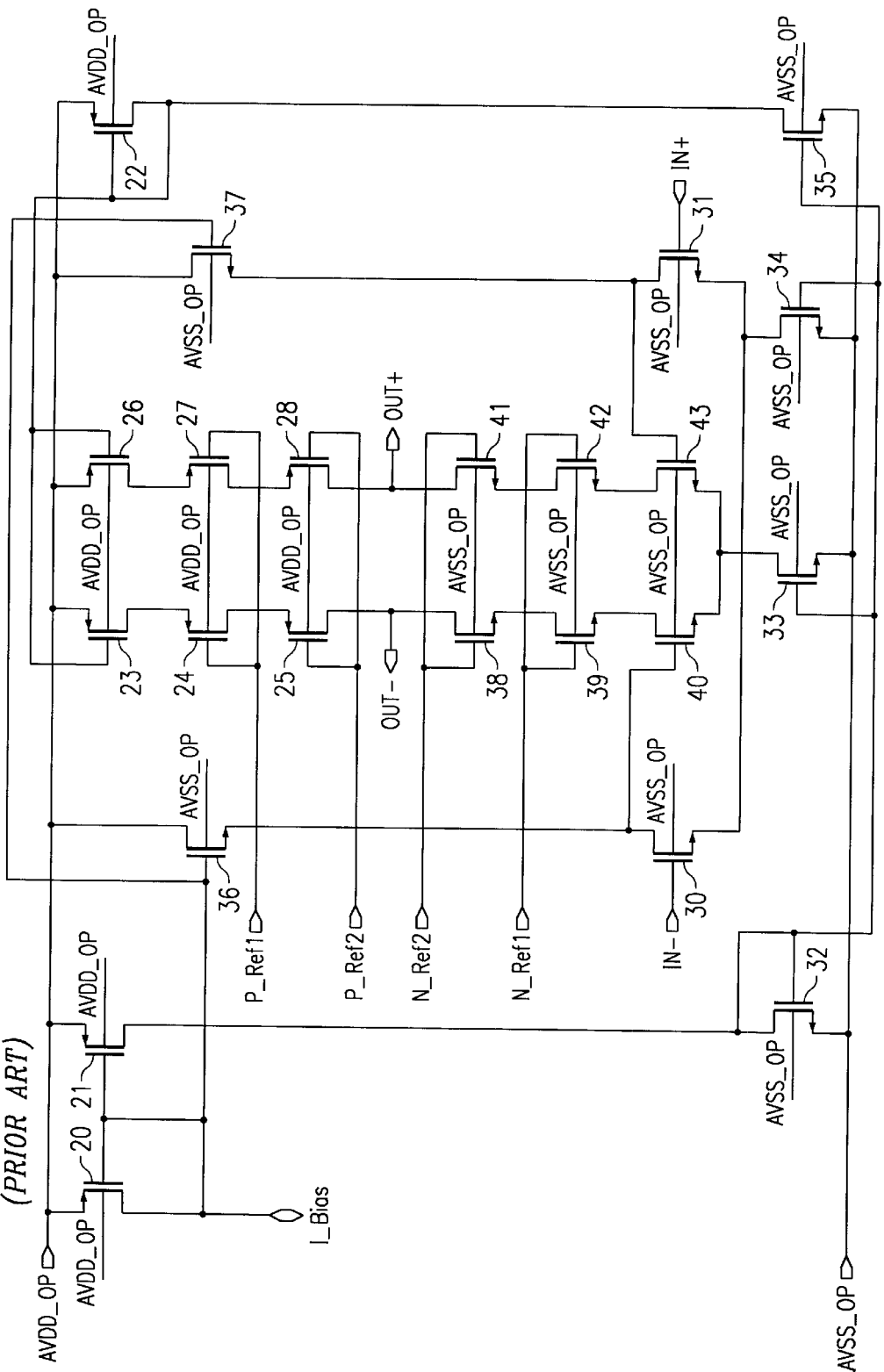
FIG. 1 is a schematic circuit diagram of a prior art telescopic opamp.

A prior art telescopic opamp is shown in FIG. 1. This prior art opamp includes PMOS transistors 20–28; NMOS transistors 30–43; references voltages P_Ref1, P_Ref2, N_Ref1, and N_Ref2; inputs IN+ and IN−; outputs OUT+ and OUT−; supply voltages AVDD_OP and AVSS_OP; and bias current I_Bias. One characteristic of opamps like the prior art telescopic of FIG. 1 is that the signal current is controlled only by the input NMOS couple 40 and 43. The current poured by the PMOS transistors 23 and 26 always keeps constant, since they are used like inert active loads, without any signal management capability.

Figure 2:
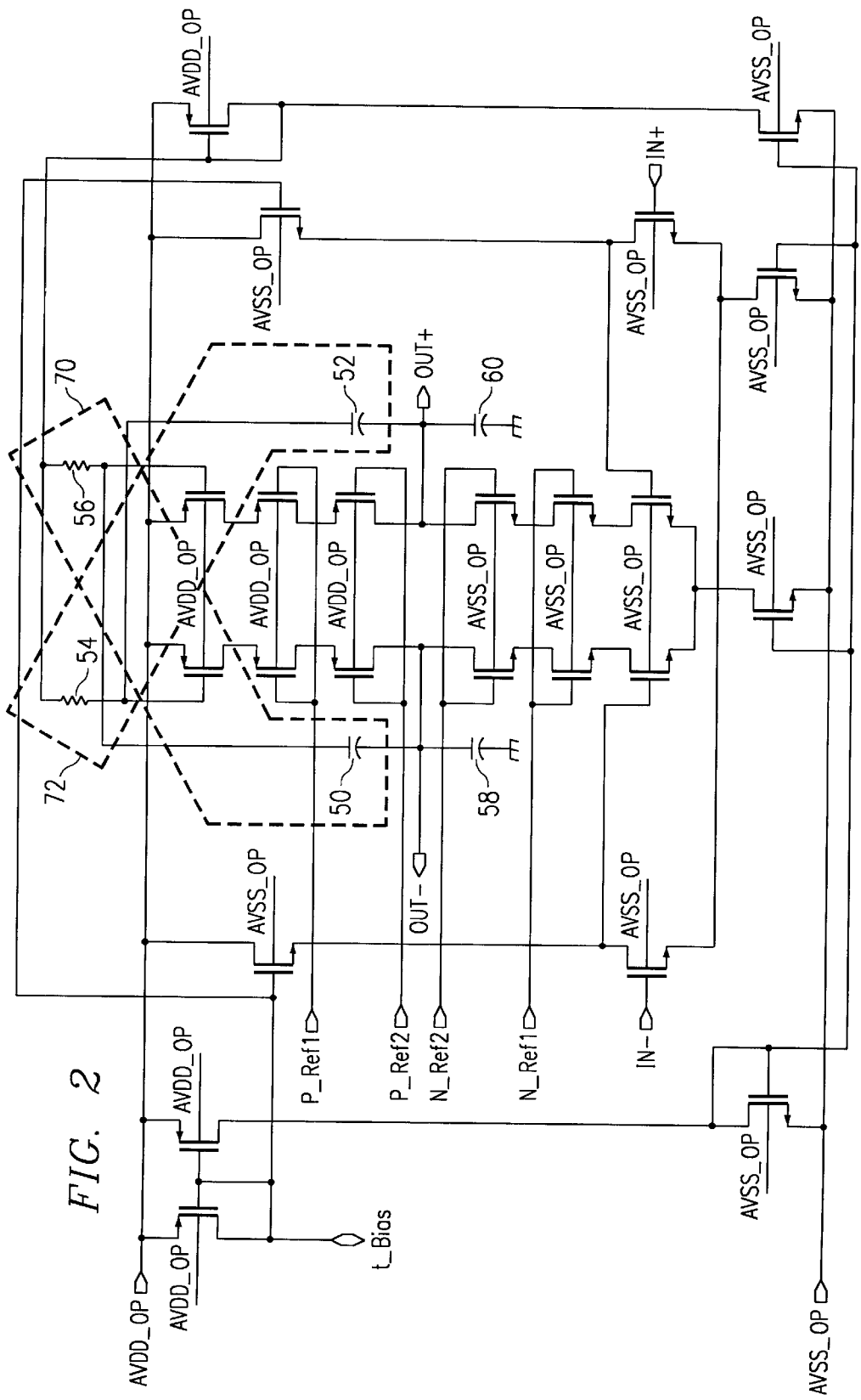
FIG. 2 is a schematic circuit diagram of a preferred embodiment opamp with dynamic slew rate booster circuit.

A preferred embodiment opamp is shown in FIG. 2. The preferred embodiment opamp includes all the elements of the prior art opamp of FIG. 1 with the addition of capacitors 50 and 52 and resistors 54 and 56. Also, shown in FIG. 2 are load capacitances 58 and 60. Capacitor 50 and resistor 56 form booster circuit 70. Capacitor 52 and resistor 54 form booster circuit 72. The preferred embodiment solution, shown in FIG. 2, exploits the gate control available on the PMOS transistors 23 and 26. During the charge-discharge differential transient of the load capacitances 58 and 60, the circuit increases the current given by the PMOS transistor 23 or 26 that is pulling up its output OUT− or OUT+, and reduces by the same amount the current provided at the other output OUT+ or OUT− that is being pulled down by the NMOS driver 43 or 40.

The gate control is accomplished through a simple, symmetrical capacitor-resistor network that implements a basic differentiator. The capacitor 50 is tied to output OUT−, and drives the gate of the opposite PMOS current driver 26 at the other end. This node is also tied to a resistor 56 that biases the PMOS gate of transistor 26 to the desired voltage reference. The capacitor 52 is tied to output OUT+, and drives the gate of the opposite PMOS current driver 23 at the other end. This node is also tied to a resistor 54 that biases the PMOS gate of transistor 23 to the desired voltage reference.

When the output OUT+ has a rising edge, it is sensed by the differentiator and drives the gate of PMOS transistor 23 on the opposite leg with a positive pulse, whose height and width can be tailored through the RC time constant and the resistance value. Then the PMOS transistor 23 gets quenched and delivers less current, which is beneficial on the other leg since output OUT− is on its falling edge, pulled down by the NMOS transistor 40 underneath.

Analogous mechanism takes place on output OUT−. While OUT− is falling, it drives a negative pulse on the opposite PMOS gate (transistor 26), which delivers more current to the rising output OUT+, reinforcing the pull-up. In practice, a band-limited positive feedback is introduced by the loop, which becomes activated only when the output is varying. This method does not call for external clocking, since it directly senses the output variations and acts to speed them up. Since it modifies the actual available current at the outputs, this technique improves the external load charging speed, and can also prove useful to speed up the transients of opamps with limited slew-rate performance.

At a clocking speed of 65 MHz with capacitors 50 and 52 at 50 fF and resistors 54 and 56 at 150 Ohm, the circuit has been successfully employed, adding only negligible load to the opamp.

Standard transient simulations, shown in FIGS. 3–5, applied to the telescopic opamp structures of FIGS. 1 and 2 show an improvement in the output settling. The preferred embodiment results 80 is compared to the prior art results 82. The vertical parameter is in mV and the horizontal parameter is in ns. The boost in the rising time can be equivalently quantified with a 25–30% enhancement of the gain-bandwidth product of the stage. FIG. 3 shows a comparison when the opamp of the most significant bit stage of the whole ADC is brought to its voltage swing edge. The simulation is at 27 Celsius degrees with nominal models. Capacitors 50 and 52 are 50 fF and resistors 54 and 56 are 120 ohm. Because of the current adjustment driven by the preferred embodiment booster, the settling has been improved over the prior art and the final voltage level has been successfully achieved within the 7.5 ns available (the standard opamp output has further 3 mV to rise).

The improvement is even more significant when the simulation is performed with weak models for the technology, and at 100 Celsius degrees (worst case corner), as shown in FIG. 4. The zoom in FIG. 4 highlights that the proposed technique gains as high as 18 mV over the standard opamp, and is completely settled. The plot in FIG. 5 illustrates the Nyquist switch of the first stage of the pipeline in full scale. The superior performance of the preferred embodiment is evident when the signal approaches +/−1V.

The preferred embodiment circuit of FIG. 2 does not use current or size or topology modifications. The circuit uses only a simple tailoring of the passive elements. Also, the solution can be applied to NMOS transistors, or used to drive differential servo-stages that can convey additional current into the telescopic core.

The preferred embodiment circuit provides several advantages. It draws no additional power from the supply. The current is determined by the current source biasing the differential stage. This solution is based only on the redistribution of the available current. Another advantage is that the biasing of the opamp is absolutely unaffected by the booster network, since the resistors are tied to the gate of PMOS transistors and no current is flowing across them. Hence, this system does not impose additional constraints to the opamp design, and in principle can be added to any opamp structure adopting an active load. Another advantage is that the kick-in of the booster is directly controlled by the voltage variations at the outputs, and is therefore self-synchronized. No external clocking signal is required. Another advantage is that the booster is extremely easy to implement, and virtually effortless from a layout standpoint. Since it uses only two resistors and two capacitors it does not require technological adjustments, but is plainly compatible with every standard CMOS process, and extremely area-effective (Capacitor values of a few 10 fF suffice for capacitors 50 and 52).

Another advantage is that this configuration provides a dynamical improvement to the output transient that speeds up the initial part of the transition front, completing faster the slew-rate limited phase of settling, and thus allowing more time for the opamp to settle according to its small-signal characteristics (gain-bandwidth product). Another advantage is that since the differentiator is not active at low frequency, the DC performance of the opamp is not affected by the booster: once it has settled, the stage will behave exactly as designed without the booster. Another advantage is that the network can be tailored even during post-layout simulations. Acting on one parameter, conveniently the value of the resistors 54 and 56, the circuit offers a degree of freedom that quickly allows for trimming the transient response, possibly compensating for unexpected slowdowns due to parasitic capacitances.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A differential circuit comprising:
   a first high side transistor coupled to a first differential output node and having a control node coupled to a bias node;
   a second high side transistor coupled to a second differential output node and having a control node coupled to the bias node;
   a first booster circuit coupled between the control node of the first high side transistor and the second differential output node;
   a second booster circuit coupled between the control node of the second high side transistor and the first differential output node.

2. The circuit of claim 1 wherein the first and second booster circuits are differentiators.

3. The circuit of claim 1 wherein the first booster circuit comprises:
   a first capacitor coupled between the control node of the first high side transistor and the second differential output node; and
   a first resistor coupled between the control node of the first high side transistor and the bias node.

4. The circuit of claim 3 wherein the second booster circuit comprises:
   a second capacitor coupled between the control node of the second high side transistor and the first differential output node; and
   a second resistor coupled between the control node of the second high side transistor and the bias node.

5. The circuit of claim 1 further comprising:
   a first low side transistor coupled to the first differential output node; and
   a second low side transistor coupled to the second differential output node.

6. The circuit of claim 5 further comprising:
   a first input transistor coupled to a control node of the first low side transistor and having a control node coupled to a first differential input node; and
   a second input transistor coupled to a control node of the second low side transistor and having a control node coupled to a second differential input node.

7. The circuit of claim 1 further comprising:
   a third high side transistor coupled between the first high side transistor and the first differential output node and having a control node coupled to a first reference node; and
   a fourth high side transistor coupled between the second high side transistor and the second differential output node and having a control node coupled to the first reference node.

8. The circuit of claim 7 further comprising:
   a fifth high side transistor coupled between the third high side transistor and the first differential output node and having a control node coupled to a second reference node; and
   a sixth high side transistor coupled between the fourth high side transistor and the second differential output node and having a control node coupled to the second reference node.

9. The circuit of claim 5 further comprising:
   a third low side transistor coupled between the first low side transistor and the first differential output node and having a control node coupled to a first reference node; and a fourth low side transistor coupled between the second low side transistor and the second differential output node and having a control node coupled to the first reference node.

10. The circuit of claim 9 further comprising:

a fifth low side transistor coupled between the third low side transistor and the first differential output node and having a control node coupled to a second reference node; and a sixth low side transistor coupled between the fourth low side transistor and the second differential output node and having a control node coupled to the second reference node.

11. The circuit of claim 1 wherein the first and second high side transistors are PMOS transistors.

12. The circuit of claim 5 wherein the first and second low side transistors are NMOS transistors.

13. An amplifier circuit comprising:

a differential input pair;

a first low side transistor coupled to a first differential output node and having a control node coupled to a first branch of the differential input pair;

a second low side transistor coupled to a second differential output node and having a control node coupled to a second branch of the differential input pair;

a first high side transistor coupled to the first differential output node;

a second high side transistor coupled to the second differential output node;

a first RC circuit having a first node coupled to a control node of the first high side transistor and a second node coupled the second differential output node; and a second RC circuit having a first node coupled to a control node of the second high side transistor and a second node coupled to the first differential output node.

14. The circuit of claim 13 wherein the first RC circuit comprises:

a first capacitor coupled between the second differential output node and the control node of the first high side transistor; and a first resistor coupled between the control node of the first high side transistor and a bias node.

15. The circuit of claim 14 wherein the second RC circuit comprises:

a second capacitor coupled between the first differential output node and the control node of the second high side transistor; and a second resistor coupled between the control node of the second high side transistor and the bias node.

16. The circuit of claim 13 wherein the first and second high side transistors are PMOS.

17. The circuit of claim 13 wherein the first and second low side transistors are NMOS.

* * * * *